United States Patent
Brask et al.

(10) Patent No.: US 6,896,774 B2
(45) Date of Patent: May 24, 2005

(54) ACOUSTIC STREAMING OF CONDENSATE DURING SPUTTERED METAL VAPOR DEPOSITION

(75) Inventors: Justin K. Brask, Portland, OR (US); Mark L. Doczy, Beaverton, OR (US); Robert B. Turkot, Jr., Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 27 days.

(21) Appl. No.: 10/382,452

(22) Filed: Mar. 6, 2003

(65) Prior Publication Data

US 2004/0173452 A1 Sep. 9, 2004

(51) Int. Cl.[7] ............................ C23C 14/34; B06B 1/00; B05D 3/00
(52) U.S. Cl. ................... 204/192.12; 427/600; 427/331
(58) Field of Search ..................... 204/192.12; 427/600, 427/331

(56) References Cited

U.S. PATENT DOCUMENTS 6,554,969 B1 * 4/2003 Chong .................. 204/192.12
2003/0196891 A1 * 10/2003 Azuma et al. ......... 204/192.12

OTHER PUBLICATIONS

"Physical Cleaning of Submicron Trenches Mixing and Cleaning in Stead Flow Rinse", Nanomanufacturing Research Institute, Northeastern University.

* cited by examiner

Primary Examiner—Steven VerSteeg
(74) Attorney, Agent, or Firm—Trop, Pruner & Hu, P.C.

(57) ABSTRACT

Metal may be deposited into trenches, vias, or other wafer openings using a physical vapor deposition chamber under vacuum. Sonic energy may be applied directly to the wafer having the openings to be filled. As a result, pinching off of the openings may be reduced or eliminated.

15 Claims, 2 Drawing Sheets

ACOUSTIC STREAMING OF CONDENSATE DURING SPUTTERED METAL VAPOR DEPOSITION

BACKGROUND

This invention relates generally to techniques for fabricating semiconductor integrated circuits.

In a number of instances, during the manufacture of semiconductor integrated circuits, vias, trenches, or other openings may be formed in a substrate. It may then be desirable to fill those openings with a metal. Depending on the size of the openings, it may be difficult to induce the metal material to completely fill the opening. There may be a number of reasons for this. One possible explanation relates to the adverse affects of surface tension and capillary forces.

In some cases, a bubble or void tends to form within the metal filled via or trench. Thus, the presence of surface tension and capillary forces may result in a void which results in incomplete filling of the trench or via. This filled trench or via with a void is a low quality electrical contact and is called a pinched off trench or via.

Thus, there is a need for a way to improve the filling of openings with metal.

DETAILED DESCRIPTION

Vias and trenches with high aspect ratios formed in semiconductor wafers are difficult to fill without pinching off. An aspect ratio is the ratio of vertical depth of the trench, via, or opening to its smallest horizontal width. In accordance with some embodiments of the present invention, sputtered metal physical vapor deposition (PVD) may be utilized to fill high aspect ratio openings.

Generally, the trenches, vias, or other openings are filled with a metal in a quasi-liquid state called a condensate. Due to the application of sonic energy through the wafer, the effects of surface tension and capillary forces may be reduced. As a result, gap-free metal structures with relatively high aspect ratios may be achieved in some embodiments.

Figure 1:
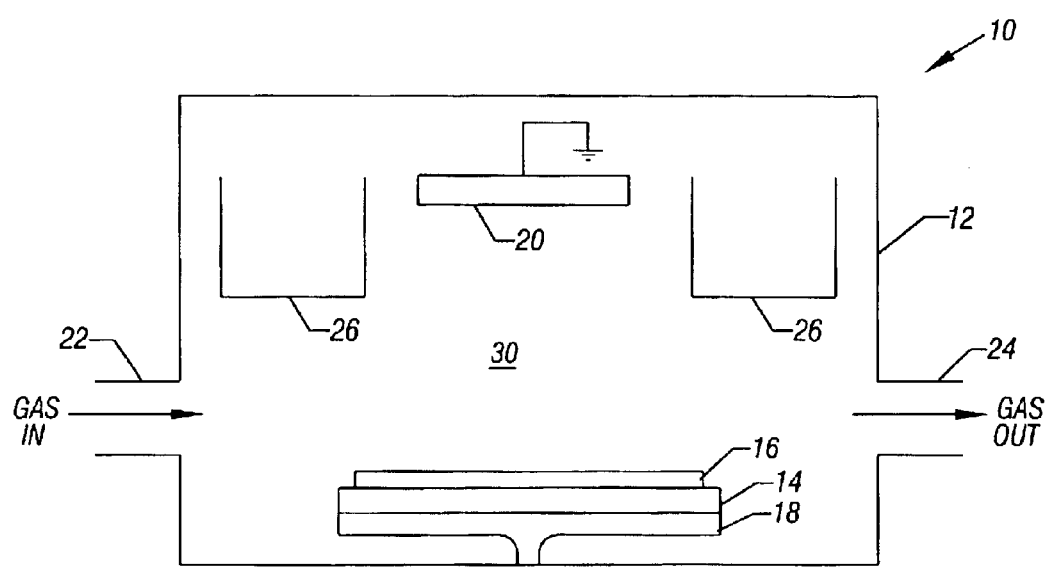
FIG. 1 is a schematic depiction of a physical vapor deposition chamber in accordance with one embodiment of the present invention.

Referring to FIG. 1, a physical vapor deposition chamber 10 may include a wafer 16 mounted on a transducer 14 over a platen 18. In some embodiments, the wafer 16 may be electrostatically held to the transducer 14. The transducer 14 may be a separate layer or may be imbedded within a platen 18.

The transducer 14 may apply sonic energy, such as ultra- or megasonic energy, in the range of about 10 to about 2000 kHz, dissipating approximately 1 to 10 watts per square centimeter. In one embodiment, the transducer 14 may be a plurality of piezoelectric drivers.

The wafer 16 is maintained within a vacuum within an enclosure 12. A plasma is established in the region 30. A gas of the appropriate species is introduced through a gas inlet 22 and drawn out through a gas outlet 24 to maintain a vacuum. A target 20 may be grounded and dark space shields 26 may be provided in some embodiments.

Sputtering is not a chemical process, but, instead, is effectively a momentum-based process. The chamber 12 may include a target 20 in the form of a solid slab of the desired fill material to be deposited. Argon gas, introduced through the inlet 22, is ionized to have a positive charge. The positively charged argon ions accelerate towards the grounded target 20. At the target 20, those ions dislodge particles from the target 20 that then scatter within the enclosure 12. Some of those scattered particles come to rest on the wafer 16.

Thus, a material may be sputter deposited on the wafer 16 without using a chemical process. The use of physical vapor deposition is applicable to a wide variety of materials.

The material that falls on the wafer 16 to form a metal condensate is briefly in a quasi-liquid state. The transducer 14 is responsible for applying sonic energy through the wafer 16 to the condensate to induce gap-free metal filling of openings defined on the wafer 16. As a result, very complete filling of high aspect ratio vias or trenches may be achieved at relatively low temperatures using any of a wide variety of precursor metals in some embodiments.

Figure 2:
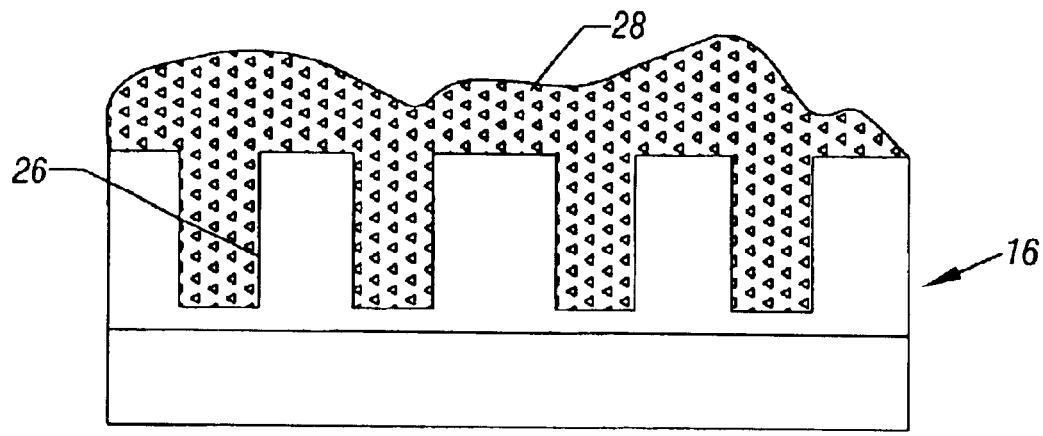
FIG. 2 shows an initial step in filling a trench or via in accordance with one embodiment of the present invention.
Figure 3:
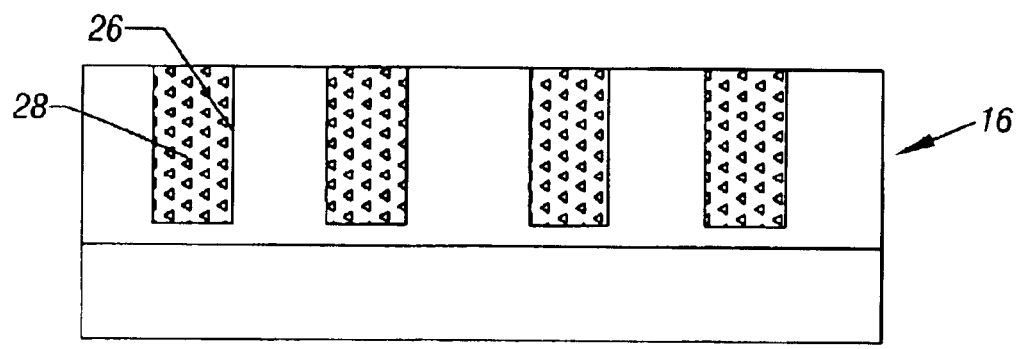
FIG. 3 shows the structure of FIG. 2 after subsequent processing in accordance with one embodiment of the present invention.

Referring to FIG. 2, the wafer 16 may be positioned over the transducer 14 in one embodiment. The wafer 16 may include a plurality of vias, trenches, or openings 26, each of which may be filled with condensate 28. After complete filling under agitation from sonic energy applied directly to the wafer 16, the structure may be polished, for example, using chemical mechanical polishing (CMP) to achieve the planarized structure shown in FIG. 3. By applying sonic energy directly, it is intended to refer to applying the energy to a solid structure integral with or physically coupled to said wafer.

In some embodiments of the present invention, as the metal condensate 28 is sputtered onto the wafer 16, it is immediately subjected to acoustic streaming upon contact with the wafer 16. The acoustic streaming is a result of the application of sonic energy to the briefly formed quasi-liquid phase condensate 28. This has the effect of reducing the presence of voids and allowing even smaller dimension vias and trenches to be filled.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   using physical vapor deposition to sputter a metal into openings in a semiconductor wafer; and
   applying megasonic energy directly to the wafer as said metal is being sputtered into said wafer openings.

2. The method of claim 1 including inducing acoustic streaming of said metal.

3. The method of claim 1 including using a transducer coupled to said wafer to apply megasonic energy directly to said wafer.

4. A method comprising:

including sputtering metal into openings formed in a semiconductor wafer;

establishing a vacuum around said wafer during said sputter deposition; and applying megasonic energy directly to said wafer while said metal is being sputtered into said openings.

5. The method of claim 4 including inducing acoustic streaming of said metal.

6. The method of claim 4 including using a transducer coupled to said wafer to apply megasonic energy directly to said wafer.

7. The method of claim 4 including securing a transducer to said wafer to generate megasonic energy directly to said wafer.

8. The method of claim 4 including filling a trench with metal.

9. The method of claim 4 including filling a via with metal.

10. A method comprising:

forming a vacuum;

depositing metal condensate in openings formed in a semiconductor substrate located within said vacuum; and perturbing said wafer using megasonic energy while said condensate is being deposited in said openings.

11. The method of claim 10 including planarizing said structure after depositing said condensate.

12. The method of claim 10 including inducing acoustic streaming of said condensate.

13. The method of claim 10 including applying the megasonic energy to the wafer itself.

14. The method of claim 13 including applying the megasonic energy to a solid structure physically coupled to said wafer.

15. The method of claim 14 including coupling a megasonic energy transducer to said wafer.

* * * * *